United States Patent [19]
Watson

[11] Patent Number: 5,467,093
[45] Date of Patent: Nov. 14, 1995

[54] LOGARITHMIC DETECTOR

[75] Inventor: Ian G. Watson, Swindon, United Kingdom

[73] Assignee: Plessey Semiconductors Limited, United Kingdom

[21] Appl. No.: 294,550

[22] Filed: Aug. 23, 1994

[30] Foreign Application Priority Data

Aug. 27, 1993 [GB] United Kingdom ............... 9317848

[51] Int. Cl.⁶ ............................................. G01S 7/285
[52] U.S. Cl. ..................... 342/175; 327/350; 330/302; 330/310
[58] Field of Search ................... 342/175; 327/350, 327/351; 330/302, 310

[56] References Cited

U.S. PATENT DOCUMENTS

| | | | |
|---|---|---|---|
| 4,104,633 | 8/1978 | Donahue et al. | 342/93 |
| 4,152,652 | 5/1979 | Taylor et al. | 455/226.2 |
| 4,588,956 | 5/1986 | Corlieu et al. | 330/2 |
| 4,648,126 | 3/1987 | Toffolo | 455/212 |
| 4,680,553 | 7/1987 | Kimura et al. | 330/2 |
| 4,689,623 | 8/1987 | Schwab et al. | 342/39 |
| 4,910,521 | 3/1990 | Mellon | 342/45 |
| 4,933,641 | 6/1990 | Hsiung et al. | 327/351 |
| 4,998,289 | 3/1991 | Rabe et al. | 455/33.1 |
| 5,164,985 | 11/1992 | Nysen et al. | 380/9 |
| 5,175,880 | 12/1992 | Brown | 455/226.1 |
| 5,296,761 | 3/1994 | Fotowat-Ahmady et al. | 327/350 |
| 5,339,187 | 8/1994 | Nelson | 359/182 |

FOREIGN PATENT DOCUMENTS

0514929A2  11/1992  European Pat. Off. .
2097620    11/1982  United Kingdom .

Primary Examiner—John B. Sotomayor
Attorney, Agent, or Firm—Kirschstein, et al.

[57] ABSTRACT

A logarithmic detector having a first input line linked to the base of the first transistor, a second line linked to the base of the second transistor, a third input line linked to the bases of third and fourth transistors, a fourth input line linked to the bases of fifth and sixth transistors, a first output line linked to the collectors of the third and sixth transistors a second output line linked to the collectors of the fourth and fifth transistors and emitters of the third and fifth transistors being linked through the first and second impedances respectively to connect to the first transistor, the emitters of the fourth and sixth transistors being linked through third and fourth impedances to the collector of the second transistor and the emitters of the first and second transistors being linked through 5th and 6th impedances respectively to a current source connected to earth.

6 Claims, 2 Drawing Sheets

LOGARITHMIC DETECTOR

BACKGROUND OF THE INVENTION

This invention relates to a logarithmic detector.

A logarithmic detector is a detector which converts an input power signal into a linear output current signal value and they are generally used in radio and radar receivers.

A conventional distributed logarithmic detector is shown in FIG. 1. The distributed logarithmic detector is a distributed device formed by a plurality of amplifiers 1, individual detectors 2 and summers 3. The amplifiers 1a, 1b are linked in series so that the input voltage across in the terminals 4 is applied as an input to amplifier 1a while the output of amplifier 1a is applied as an input to amplifier 1b and the output of amplifier of 1b is output from the distributed detector at output terminals 5. The amplifiers 1 are of the limiting output amplitude type. The detectors 2 each have a logarithmic response and the detectors 2a, 2b, 2c are arranged to detect the various voltages along the amplifier chain. Detector 2a detects the unamplified input voltage before amplification by amplifier 1a, detector 2b detects the amplified output voltage of amplifier 1a before amplification by amplifier 1b while detector 2c detects the doubly amplified output of the amplifier 1b. The outputs from the detectors 2a, 2b and 2c are all summed in summers 3a, 3b to provide a summed log output at log output terminals 6.

Distributed detectors of this type are used because the range of response of the individual detector elements 2 is generally relatively small compared to the desired range of the complete distributed detector and the use of multiple detectors with amplifier and summer chains allows the range of the distributed detector as a whole to be extended to the desired range.

Obviously the number of amplifiers, detectors and summers can be increased as required to give a desired range of response.

The overall log-linearity of the distributed detector is dependent on the log-linearity of the individual detectors and the non Log-linearity of known detectors is such that the performance of known distributed logarithmic detectors is limited by it.

Another problem with known detectors is that their log linearity is dependent on the amplification factor of the amplifier they are associated with in a distributed detector, the larger the gain the worse the log linearity. As a result to obtain good log-linearity in known distributed detectors low gains must be used, so for a large range a large number of stages are required, as well as the obvious cost disadvantage this results in a large delay as a signal passes through the distributed detector which can be a problem, particularly in radar systems.

This invention was intended to provide a logarithmic detector having an improved logarithmic linearity.

SUMMARY OF THE INVENTION

This invention provides a logarithmic detector comprising first to fourth input lines, first and second output lines, first to sixth transistors, first to sixth impedances and a current source arranged such that the first input line is linked to the base of the first transistor and the second input line is linked to the base of the second transistor, the third input line is linked to a first circuit node which is in turn linked to the bases of both the third and fourth transistors and the fourth input line is linked to a second circuit node which is linked to the bases of both the fifth and sixth transistors; the first output line is linked to a third circuit node which is linked to the collectors of both the third and sixth transistors, the second output line is linked to a third circuit node which is linked to the collectors of the fourth and fifth transistors, the emitters of the third and fifth transistors are linked through the first and second impedances respectively to the fourth circuit node and the fourth circuit node is linked to the collector of the first transistor, the emitters of the fourth and sixth transistors are linked through the third and fourth impedances respectively to the fifth circuit node, the fifth circuit node is linked to the collector of the second transistor; the emitters of the first and second transistors are linked through the fifth and sixth impedances respectively to the sixth circuit node and the sixth circuit node is connected to earth by the current source.

This provides a logarithmic detector having very high log linearity and able to be used in conjunction with a high gain amplifier without any decrease in log linearity.

It has been found that provided component values within the detector are matched the absolute component values have little effect on log linearity, easing manufacture.

BRIEF DESCRIPTION OF THE DRAWINGS

A logarithmic detector according to the invention will now be described by way of example only with reference to the accompanying diagramatic figures in which.

DETAILED DESCRIPTION

Figure 1:
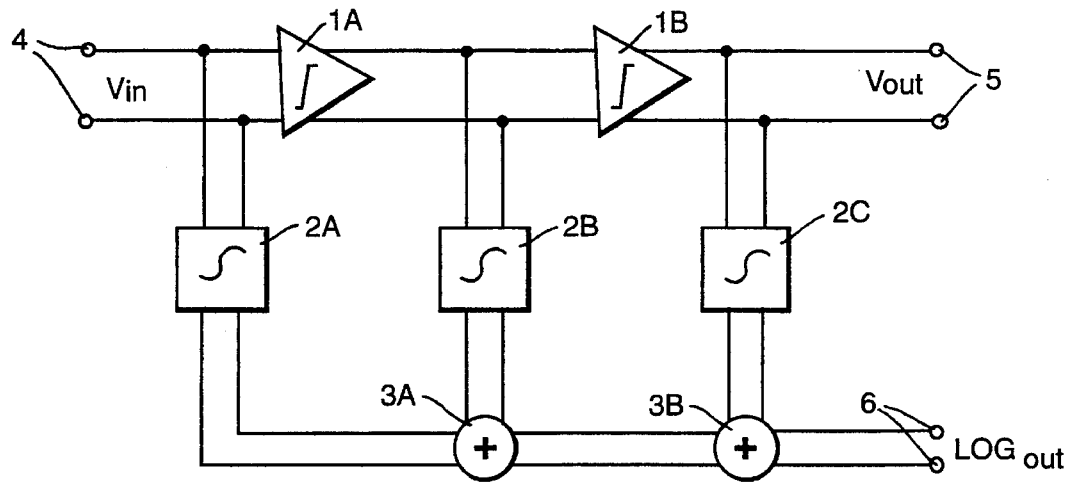
FIG. 1 shows a conventional logarithmic detector.
Figure 2:
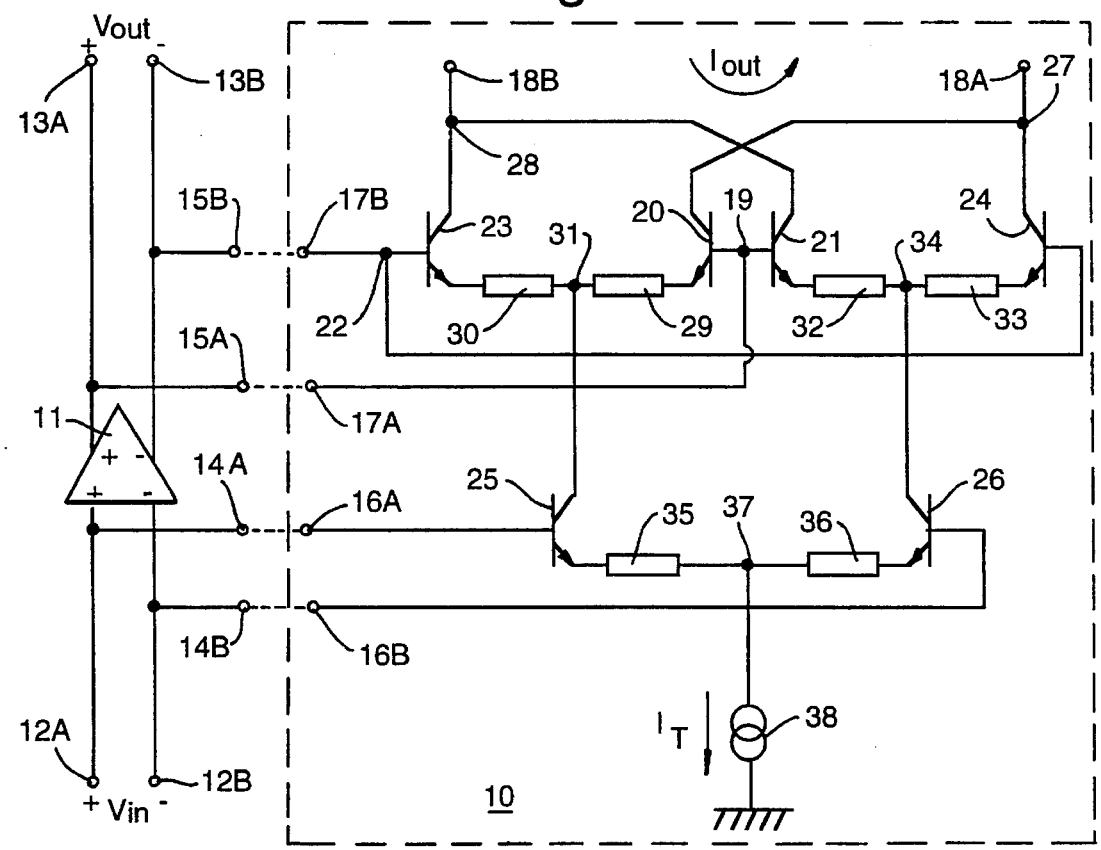
FIG. 2 shows a logarithmic detector employing the invention.

Referring to FIG. 2 an improved logarithmic detector 10 is shown. Associated with the logarithmic detector 10 is an amplifier 11 supplied with a voltage signal along a pair of input lines 12 and generating an output along the pair of output lines 13. The positive input and output lines are 12a and 13a respectively, while the negative input and output lines are 12b and 13b respectively. The input signal on lines 12 before amplification by amplifier 11 is supplied to the logarithmic detector 10 along a pair of lines 14a, 14b connected to the positive and negative input lines 12a and 12b respectively while the output signal on the lines 13 after amplification by the amplifier 11 is supplied to the logarithmic detector 10 along a pair of lines 15a, 15b connected to the positive output line 13a and negative output line 13b respectively.

The logarithmic detector 10 has two pairs of input lines, a first pair comprising first and second input lines 16a and 16b respectively and a second pair comprising third and fourth input lines 17a and 17b respectively, and a pair of output lines comprising first and second output lines 18a and 18b respectively. In FIG. 2 first input line 16a is connected to line 14a and thus to positive input line 12a while second input line 16b is connected to line 14b and thus to negative input line 12b, similarly third input line 17a is connected to line 15a and hence to positive output line 13a while fourth input line 17b is linked to line 15b and hence to negative output line 13b. However as will be explained later this is not the only possible arrangement and to emphasise this the connections between lines 14 and 15 and lines 16 and 17 are shown as dashed lines. The lines 14 and 15 and lines 16 and 17 are preferably AC coupled to avoid any miss-match problems, but could be D.C. coupled.

The third input line 17a of the detector 10 is connected through a first circuit node 19 to the bases of third and fourth transistors 20 and 21 respectively, similarly the fourth input line 17b of the detector 10 is connected through a second circuit node 22 to the bases of fifth and sixth transistors 23 and 24 respectively.

The first input line 16a is connected to the base of a first transistor 25 while the second input line 16b is similar connected to the base of a second transistor 26. All of the transistors in the detector 10 are bipolar junction transistors (B.J.T.).

The first output line 18a is connected through a third circuit node 27 to the collectors of the third and sixth transistors 20 and 24 while the second output line 18b is connected through a fourth circuit node 28 to the collectors of the fourth and fifth transistors 21 and 23. The emitters of third and fifth transistors 20 and 23 are connected through first and second impedances 29 and 30 respectively to a fifth circuit node 31 which is in turn connected to the collector of the first transistor 25. Similarly the emitters of the second and fourth transistors 21 and 24 are connected through third and fourth impedances 32 and 33 respectively to a sixth circuit node 34 which is in turn connected to the collector of the second transistor 26. Finally the emitters of the first and second transistors 25 and 26 are connected through fifth and sixth impedances 35 and 36 respectively to a sixth circuit node 37 which is connected to earth by a current source 38 which passes a current $I_T$ to earth from the sixth node 37.

The detector 10 generates a symmetrical non-linear multiplying function and in combination with the amplifier 10 this generates a current flowing from the second output line 18b to the first output line 18a, the magnitude of the current being the base 10 logarithm of the input voltage ($V_{IN}$) across the input lines 12a and 12b.

Due to the symmetric nature of the circuitry of the detector 10 the input line pairs 16 and 17 can be swapped and/or reversed without effecting the output, provided each pair 16a, 16b or 17a, 17b of input lines are connected to a pair of lines 14a, 14b or 15a, 15b it does not matter which pair 16 or 17 is connected to which pair 14 or 15 and it does not matter which members of each pair are connected to which members of the other pair. If the lines 14 and 15 and 16 and 17 are DC coupled it will be necessary to ensure that the biasing of the circuit is correct, and alter it if necessary, if the connections of the lines are altered.

With no input signal on lines 12 the output signal on output lines 18 is naturally balanced (or zero if the difference is measured), and as a result the frequency response of the detector 10 at low power levels is very good.

The impedances 29, 30, 32, 33, 35 and 36 would normally be resistors but reactances could be used at appropriate frequencies.

For any given operating current $I_T$ and amplifier gain the log-linearity of the detector can be optimised by varying the values of the impedances 29, 30, 32, 33, 35 and 36.

The amplifier 11 is preferably of the limiting output amplitude type in order to prevent the detector being driven into saturation regardless of the input signal to the amplifier, however this is not essential.

If desired a degenerating impedance could be placed in series with the current source 38 between the sixth circuit node 37 and earth, this could be a resistor or reactance depending on the operating frequency.

Figure 3:
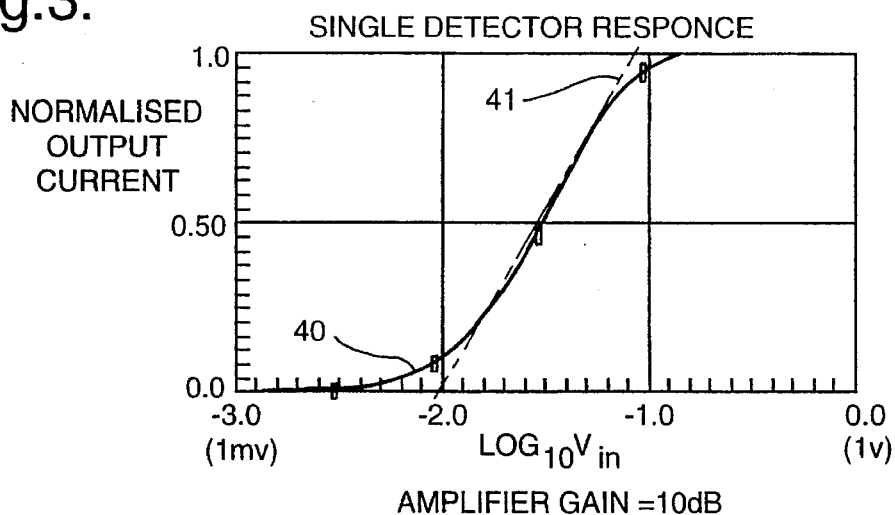
FIG. 3 is a graph of the performance of the detector of FIG. 2.

The response of the detector 10 shown in FIG. 2 is graphically illustrated in FIG. 3 where a graph of normalised output current against $\log_{10}$ input voltage ($V_{in}$) is shown. Since the output current is normalised the value zero corresponds to no current and the value 1 corresponds to the maximum possible current. The response curve shown in FIG. 3 is for the detector 10 when used with an amplifier 11 with a gain of 10 dB.

As can be seen the output current against $\log_{10}$ input voltage is very close to linear for most of the current range as shown by the line 40, a true linear log response is shown by the dashed line 41.

It has been realised that because the non-linear parts of the detector response 40 at each end of its operating range are symmetrical and odd a plurality of detector 10 can be arranged in a distributed detector and when their outputs are summed the non-linear parts of the responses of consecutive detectors 10 in the series will cancel one another out. This can be exploited to produce a distributed detector having a very high level of log-linearity.

Figure 4:
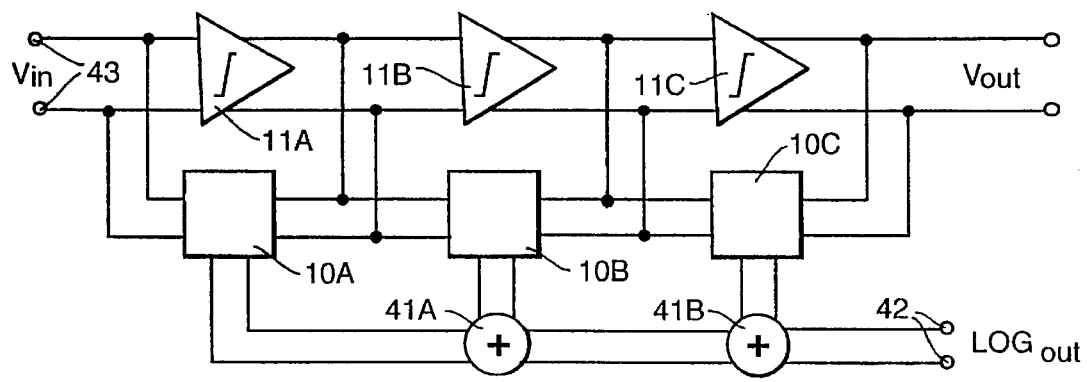
FIG. 4 shows a distributed amplifier employing a plurality of detectors as shown in FIG. 2.

Such a distributed detector is shown in FIG. 4. Detectors 10a, 10b and 10c are used in conjunction with a chain of 3 amplifiers 11a, 11b and 11c arranged so that an input signal applied along lines 43 is supplied unamplified to one pair of inputs of amplifier 10a and to amplifier 11a, the amplified output from amplifier 11a is then supplied to the second pair of inputs of detector 10a and the first pair of inputs of detector 10b and as an input to amplifier 11b. The amplified output of amplifier 11b is then supplied to the second pair of input leads of the detector 10b and is passed on along the chain. The outputs of detectors 10a and 10b are summed by a summer 41a and a further summer 41b summs the output of the remaining detector 10c to provide a log output on output lines 42. It will be obvious how this distributed detector arrangement can be extended to any desired number of amplifiers and detectors to provide a response across any desired range of input signals.

Figure 5:
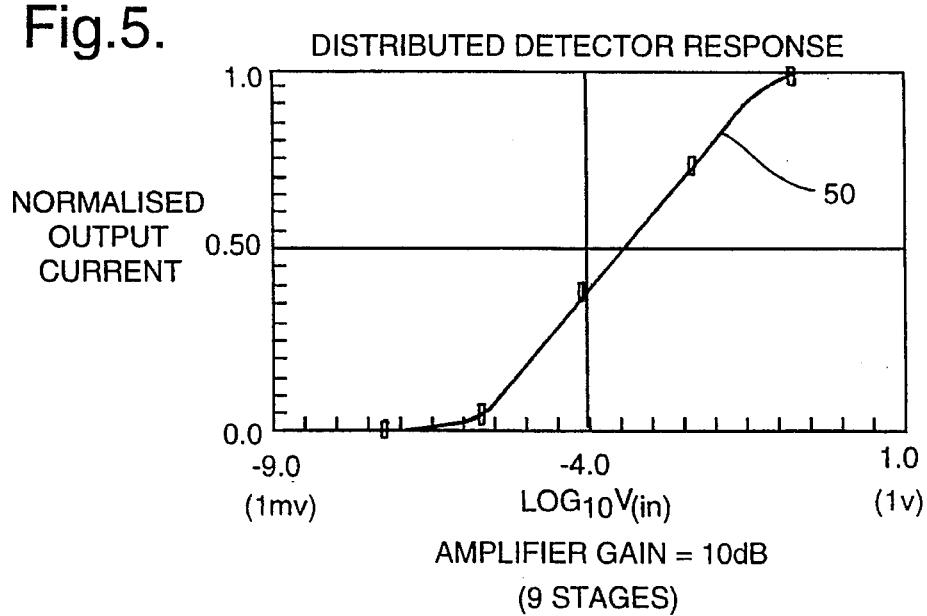
FIG. 5 is a graph of the performance of the distributed detector of FIG. 4, identical parts having the same reference numerals throughout.

The response of a distributed detector as shown in FIG. 4 comprising 9 amplifier stages each of 10 db gain and 9 detector stages is shown in FIG. 5 where the curve 50 is a plot of normalised output current against $\log_{10}$ input voltage. As can be seen due to the cancelling out of the non linear sections of the outputs of each separate detector the distributed detector is log-linear across almost its entire range with only a small non linearity at each end due to the uncorrected non linear sections of the responses of the first and last detectors in the chain.

The output of the detector or the output of the distributed detector can be temperature compensated by post-multiplication of the output signal or by pre-multiplication of the input signal. Alternatively the current $I_T$ through the current source 38 could be controlled to change with temperature.

A particular advantage of a detector of this type is that when used as a distributed detector to detect radar signals the individual detectors will not generate inter-modulation which could effect the outputs of detectors further along the distributed detector chain.

In practice a feedback loop would be provided to prevent oscillation of the distributed detector, but this is omitted for clarity.

Although the examples described use BJT's as transistors, other types of transistor such as FET's IGFET's or MOS- FET's could be substituted.

I claim:

1. A logarithmic detector comprising first to fourth input lines, first and second output lines, first to sixth transistors, first to sixth impedances and a current source arranged such that the first input line is linked to the base of the first transistor and the second input line is linked to the base of the second transistor, the third input line is linked to a first circuit node which is in turn linked to the bases of both the third and fourth transistors and the fourth input line is linked to a second circuit node which is linked to the bases of both the fifth and sixth transistors; the first output line is linked to a third circuit node which is linked to the collectors of both the third and sixth transistors, the second output line is linked to a third circuit node which is linked to the collectors of the fourth and fifth transistors, the emitters of the third and fifth transistors are linked through the first and second impedances respectively to the fourth circuit node and the fourth circuit node is linked to the collector of the first transistor, the emitters of the fourth and sixth transistors are linked through the third and fourth impedances respectively to the fifth circuit node, the fifth circuit node is linked to the collector of the second transistor; the emitters of the first and second transistors are linked through the fifth and sixth impedances respectively to the sixth circuit node and the sixth circuit node is connected to earth by the current source.

2. A detector as claimed in claim 1 in which a seventh impedance is placed in series with current source between the sixth circuit node and earth.

3. A detector as claimed in claim 1 in which the impedances are resistors.

4. A detector as claimed in claim 1 when used in conjunction with an amplifier arranged such that the unamplified input to the amplifier is supplied across the first and second inputs to the detector and the amplified output of the amplifier is applied across the third and fourth inputs.

5. A detector as claimed in claim 1 when used in conjunction with an amplifier arranged such that the unamplified input to the amplifier is supplied across the third and fourth inputs to the detector and the amplified output of the amplifier is applied across the first and second inputs.

6. A distributed logarithmic detector comprising a plurality of logarithmic detectors as claimed in claim 1.

* * * * *